United States Patent [19]

Medwin

[11] 4,336,550
[45] Jun. 22, 1982

[54] CMOS DEVICE WITH SILICIDED SOURCES AND DRAINS AND METHOD

[75] Inventor: Lawrence B. Medwin, Edmonds, Wash.

[73] Assignee: RCA Corporation, New York, N.Y.

[21] Appl. No.: 132,138

[22] Filed: Mar. 20, 1980

[51] Int. Cl.³ .............................................. H01L 27/02
[52] U.S. Cl. ...................................... 357/42; 357/15; 357/23; 357/4; 357/59
[58] Field of Search ................... 357/15, 23, 4, 42, 59, 357/67

[56] References Cited

U.S. PATENT DOCUMENTS

| | | | |
|---|---|---|---|
| 3,958,266 | 5/1976 | Athanas | 357/4 X |
| 3,968,272 | 7/1976 | Anand | 357/15 X |
| 4,128,670 | 12/1978 | Gaenssien | 357/15 X |
| 4,141,022 | 2/1979 | Sigg | 357/67 X |

OTHER PUBLICATIONS

Ames et al., *IBM Tech. Bull.*, vol. 9, No. 10, Mar. 1967, p. 1470.

*Primary Examiner*—Martin H. Edlow
*Attorney, Agent, or Firm*—Birgit E. Morris; Donald S. Cohen; Lawrence P. Benjamin

[57] ABSTRACT

A novel insulated gate field effect device is described wherein the device, having been formed from an island of semiconductive material on an insulative substrate, is characterized by the absence of discrete drain and source zones. The device further includes a gate structure and shallow metal silicided contact areas on the surface of the island adjacent the gate structure.

2 Claims, 7 Drawing Figures

CMOS DEVICE WITH SILICIDED SOURCES AND DRAINS AND METHOD

BACKGROUND OF THE INVENTION

This invention relates, in general, to semiconductor devices and, more particularly, to a novel deep depletion complementary MOS device.

The typical metal oxide semiconductor field effect transistor (MOS/FET) requires the formation of a conducting channel, of opposite conductivity type to that of the bulk, at the surface of the semiconductive material. Traditionally, to operate a transistor in the enhancement mode, a body of semiconductive material of one conductivity type is provided with active zones of opposite conductivity type which zones are embedded below the surface of the semiconductive material to form drain and source zones. The conducting channel is formed between the drain and source zones by applying appropriate biasses to the source and drain zones and to a gate structure located on the surface of the semiconductive material at the channel region but separated therefrom by a thin insulating layer. To operate such a device which has been provided, for example, with N+ type drain and source zones formed in a P or P-type semiconductor body, the surface region, formed between the drain and source zones, will invert to form a conducting channel when the gate is appropriately biassed. Thus, a normally nonconducting device is made conducting when the voltage applied to the gate structure is lower than the voltage applied to the source zone.

Another type of transistor operating in the enhancement mode is referred to as a deep depletion thin film device. This device is typically fabricated from a pair of N+ zones, for example, that have been formed in an N or N-type semiconductor body. In this instance, the N-type semiconductor body portion between the N+ drain and source zones (the channel region) is normally nonconductive in the absence of a gate/source bias. For a detailed exegesis of the operation of such deep depletion devices, attention is directed to an article authored by S. R. Hofstein, entitled "An Analysis of Deep Depletion Thin-Film MOS Transistors" appearing in IEEE Transactions on Electron Devices, Vol. ED-13, No. 12, December 1966 at pages 846–854. Another article, dealing with the same subject matter is authored by F. P. Heiman, entitled "Thin-Film Silicon-On-Sapphire Deep Depletion MOS Transistors" appears at pages 855–862 of the same volume.

Thus, as shown in both articles when appropriate voltages are applied to the N+ drain and source zones of deep depletion thin film devices, the normally nonconducting region formed at the surface between the drain and source zones is made to "accumulate" and become conductive when the voltage applied to the gate structure is higher with respect to the voltage applied to the source zone. Conversely, when a deep depletion thin film device is fabricated from a pair of P+ type zones formed in a P or P-semiconductive body, the device will "accumulate" and form a conductive channel when the voltage applied to the gate is lower with respect to the voltage applied to the source.

While the art is replete with many instances of Complementary Metal Oxide Semiconductor (CMOS) inverters, they all share the same feature in that the distinct zones of opposite conductivity or zones of higher concentrations of the same conductivity are utilized to form the various devices. It is, therefore, rationalized that a CMOS device that is characterized by the absence of the distinct source and drain zones would be much more easily fabricated since it would require fewer diffusion or ion implantation steps and would also occupy less space on a given size chip. In addition, it will now become obvious to those skilled in the art that by decreasing the number of processing steps the yield will increase accordingly.

SUMMARY OF THE INVENTION

An insulated gate field effect transistor is described wherein an island of semiconductive material is formed on an insulating substrate. The device is characterized by the absence of discrete drain and source zones and further includes a gate structure and shallow metal silicide contact areas on the surface of the island adjacent the gate structure.

DETAILED DESCRIPTION OF THE INVENTION

While the following exegesis will be presented in terms of using sapphire as an insulative substrate or carrier, I do not wish to be so limited. Those skilled in the art will readily recognize that when the expression silicon-on-sapphire (SOS) or the word sapphire is used, it is also meant to include spinel or monocrystalline beryllium oxide as the substrate.

Figure 1:
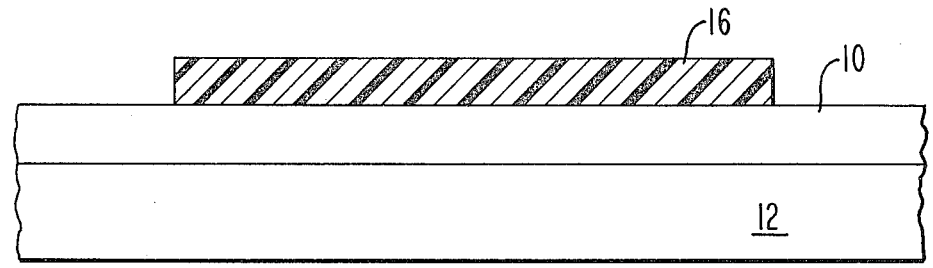
FIGS. 1–6 are cross sectional views illustrating the various steps in the process of forming the deep depletion device of the subject invention.

Referring now to FIG. 1, there is shown the first of the steps that may be utilized in the formation of my device wherein a layer of monocrystalline silicon 10 is epitaxially grown over the entire surface of sapphire substrate 12 to a thickness of about 6000 Angstroms ±500 Angstroms using any one of many well known techniques, one of which is the thermal decomposition of silane ($SiH_4$) in a hydrogen ($H_2$) carrier. An island is formed by first growing a masking oxide ($SiO_2$) layer 16 over the entire epitaxially grown layer of silicon 10 and then providing the masking oxide with a patterned layer of photoresist (not shown) to define the boundaries of the island. The unmasked portions of masking oxide 16 are then etched using a buffered hydrofluoric (HF) acid solution to produce the structure shown in FIG. 1. After etching those portions of $SiO_2$ 16 not covered by the photoresist, the photoresist is removed and the now etched $SiO_2$ layer 16 is used as a mask in order to etch the epitaxially grown silicon layer 10. This may be accomplished by using a buffered potassium hydroxide (KOH) solution.

Figure 2:
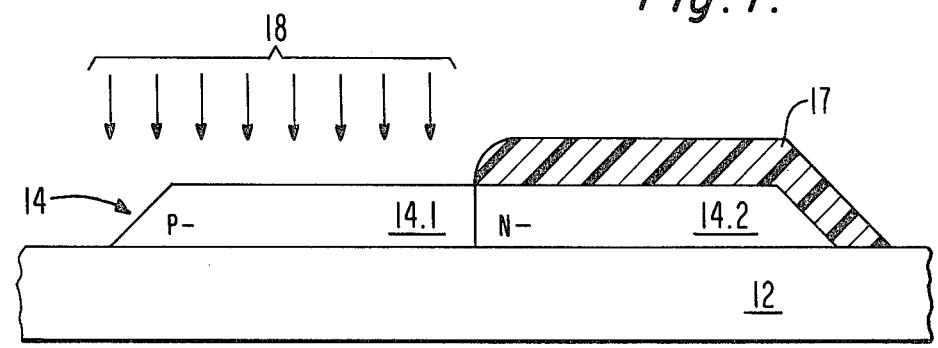
Figure 3:
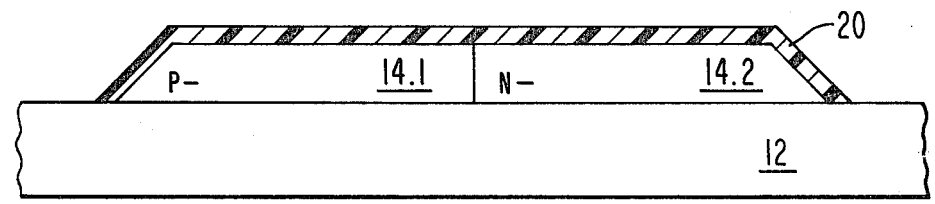

Having defined island 14, as shown in FIG. 2, all oxide masking material is then removed using an HF solution. Thereafter, a layer of patterned photoresist material 17 is formed on an island 14 in a well-known manner and conductivity modifiers, such as boron, as indicated by arrows 18, are implanted into only a portion of island 14 forming the P-type region 14.1. Masking material 17 is removed and a second masking layer (not shown) is deposited over the now doped region 14.1 and the process is repeated using phosphorus as the dopant to form N-type zone 14.2. The masking material is then removed and a layer of channel oxide 20 is grown over island 14. This layer of channel oxide 20, typically has a thickness of about 500-600 Angstroms and may be carried out at a temperature of about 900°-950° C. in steam and hydrochloric acid. The resultant structure will be as shown in FIG. 3.

Figure 4:
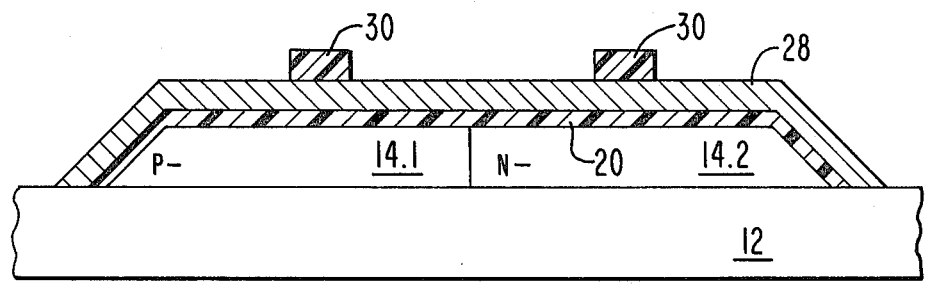

The next step after the formation of channel oxide layer 20 is shown in FIG. 4 and consists of depositing a layer of polycrystalline silicon (polysilicon) 28 which may be done by the pyrolytic decomposition of a silicon bearing material such as silane ($SiH_4$) at a temperature of about 600°-700° C. for a sufficient period of time in order to form polysilicon layer 28 to a thickness of about 5000-6000 Angstroms. Thereafter, a layer of patterned photoresist 30 is formed on polysilicon layer 28 in the areas of zones 14.1 and 14.2 where it is desired to form the gate structure. Having provided the structure with gate masks 30, the exposed portions of polysilicon layer 28 are etched using a KOH solution to form polysilicon gates. This etching step is followed by a second etch, using an HF solution, to remove all exposed areas of channel oxide except those portions of channel oxide layer 20 that are under gate masks 30.

Figure 5:
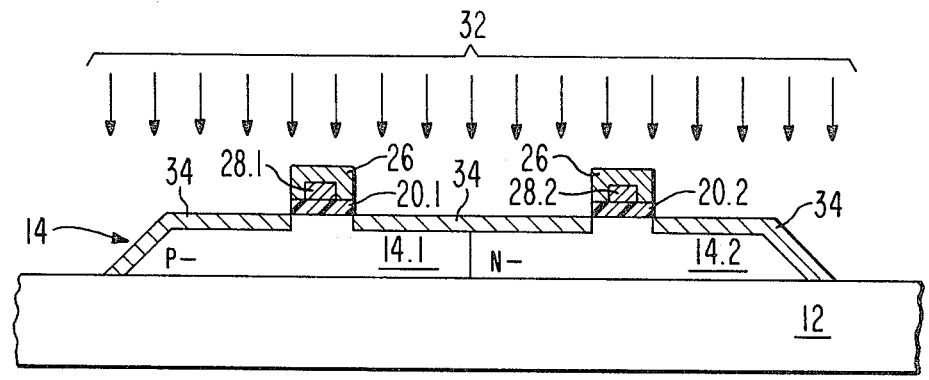

Referring now to FIG. 5 for the further processing of my device, there is shown island 14 consisting of a P-type zone 14.1 and N-type zone 14.2 with the gate electrode 28.1 insulated from the surface of zone 14.1 by gate insulator 20.1. Similarly, N-type zone 14.2 is also provided with a gate structure consisting of polysilicon electrode 28.2 which is insulated from the surface of the N-type zone 14.2 by gate insulator 20.2. The next following step is to silicide all exposed areas of silicon and polysilicon. In this embodiment, tungsten silicide is chosen, by way of example, as a means for reducing the sheet resistance of zones 14.1 and 14.2 and gates 28.1 and 28.2. However, those skilled in the art will readily recognize that various other metals such as those appearing in the periodic tables under Groups IVB, VB, VIB, may also be used. To accomplish the siliciding, tungsten is first sputtered over the entire exposed surfaces of island 14 as well as over the exposed surfaces of gates 28.1 and 28.2 as shown symbolically by arrows 32, followed by an annealing step which consists of heating the sputtered tungsten in an inert atmosphere maintained at a temperature of about 700°-800° C. for a sufficient period of time to produce silicided regions 34 on island 14 and silicided regions 26 on gates 28.1 and 28.2. During this annealing operation, it has been found that sputtered tungsten will react only with the exposed surfaces of zones 14.1 and 14.2 as well as the exposed portions of gates 28.1 and 28.2 to the exclusion of any metal sputtered on any exposed portions of channel insulator 20. During the annealing step, the temperature of the device is maintained below the silicide eutectic and thus, will not ball or creep beyond the edges of the exposed polysilicon as would a liquid eutectic. Any tungsten that is inadvertently sputtered or deposited on the edges of gate insulators 20 may be easily removed using hot, concentrated Aqua Regia.

Figure 6:
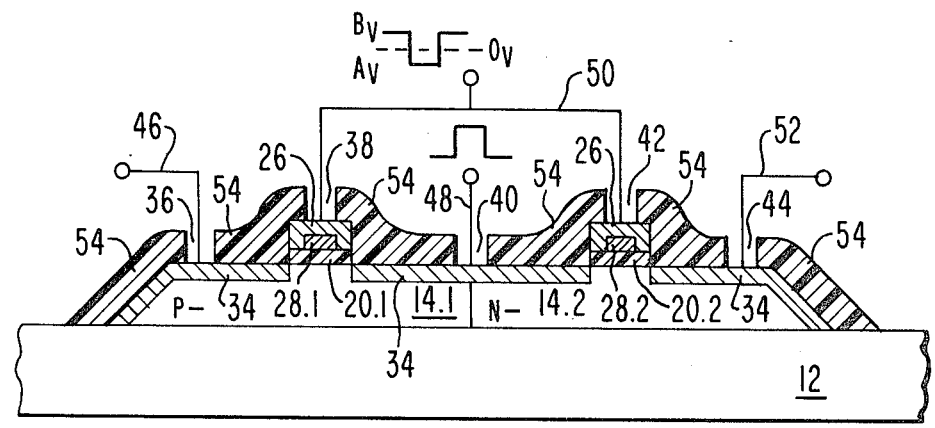

After the formation of the silicided areas 26 and 34, the device is now completed as shown in FIG. 6 by covering all exposed surfaces with a layer of field oxide 54 in any one of many well-known processes to a thickness of about 5000 Angstroms. One such process is a chemical vapor deposition technique.

Thereafter, the structure is provided with a mask (not shown) and contact openings 36, 38, 40, 42 and 44 are etched to form contact openings which, as shown in FIG. 6, are provided with metal leads 46, 48, 50 and 52 which are in ohmic contact with the various silicided regions of zones 14.1 and 14.2. Lead 50 also serves to interconnect gate 28.1 with 28.2 to form an inverter circuit.

Figure 7:
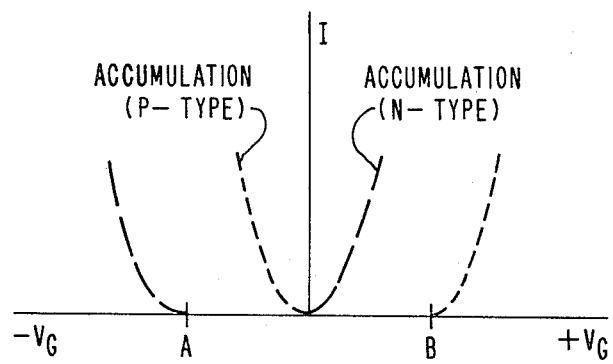
FIG. 7 is a graph of gate voltage versus channel current flow utilized in the description of the invention.

Referring now to FIGS. 6 and 7 for a brief description of the operation of my novel device where FIG. 7 is a plot of current flow (I) versus gate voltage ($V_G$). Thus, when, for example, a negative voltage is applied to lead line 52 and lead line 46 has a positive voltage applied thereto, the N-type device 14.2 may be made to "accumulate" in the region under gate 28.2 when a positive voltage of value "B" (FIG. 7) is applied to gate 28.2 by lead line 50. This will cause the N-type device 14.2 to conduct and apply the negative voltage to lead line 48. Conversely, when the voltage applied to lead line 50 is made negative to at least the level of Voltage A, (FIG. 7), the P-type device will "accumulate" in the region under the gate 28.1 causing the P-type device 14.2 to conduct applying the positive voltage to lead line 48.

Thus, there has been described the novel deep depletion thin film CMOS device that is noted by the absence of distinct source and drain zones, thus allowing the device to be more easily and efficiently fabricated since fewer process steps are required.

What is claimed is:

1. A thin film deep depletion circuit device comprising:
   first and second insulated gate field effect transistors formed from an island of semiconductor material of first and second respective opposite conductivity types, the transistors formed on an insulative substrate selected from the group consisting of sapphire, spinel and monocrystalline beryllium oxide;
   each transistor being characterized by the absence of discrete drain and source zones; and
   each transistor further including;
   a gate structure on only a portion of the surface of the island associated with each transistor and insulated therefrom;
   shallow metal silicided areas on the remainder of the surface of the island adjacent each gate structure; and
   lead lines in ohmic contact with the silicided areas and with each gate structure.

2. The thin film device of claim 1, wherein each gate structure comprises:
   a strip of polycrystalline silicon insulated from the surface of the island by a layer of silicon dioxide; and
   shallow metal silicided areas on those surfaces of each polycrystalline silicon strip not in contact with the silicon dioxide layer.

* * * * *